(12) United States Patent
Huang et al.

(10) Patent No.: US 11,746,964 B2
(45) Date of Patent: Sep. 5, 2023

(54) LED BULB WITHOUT DRIVING POWER SUPPLY

(71) Applicant: RUIJIN DEYU OPTOELECTRONICS CO., LTD., Ruijin (CN)

(72) Inventors: Zunxiang Huang, Ruijin (CN); Yuanming Li, Ruijin (CN); Dehua Huang, Ruijin (CN); Yuanjian Li, Ruijin (CN)

(73) Assignee: RUIJIN DEYU OPTOELECTRONICS CO., LTD., Ruijin (CN)

(*) Notice: Subject to any disclaimer, the term of this patent is extended or adjusted under 35 U.S.C. 154(b) by 0 days.

(21) Appl. No.: 17/577,028

(22) Filed: Jan. 17, 2022

(65) Prior Publication Data
US 2022/0136660 A1 May 5, 2022

Related U.S. Application Data

(63) Continuation-in-part of application No. 17/179,321, filed on Feb. 18, 2021, now Pat. No. 11,470,701.

(30) Foreign Application Priority Data

Sep. 22, 2020 (CN) .......................... 202022082013.1
Sep. 22, 2020 (CN) .......................... 202022082352.X
Sep. 30, 2020 (CN) .......................... 202022217458.6

(51) Int. Cl.
*F21K 9/23* (2016.01)
*F21K 9/235* (2016.01)
(Continued)

(52) U.S. Cl.
CPC .............. *F21K 9/235* (2016.08); *F21K 9/232* (2016.08); *F21K 9/238* (2016.08); *F21Y 2115/10* (2016.08)

(58) Field of Classification Search
CPC ........ H05B 45/37; H05B 45/39; H05B 45/40; H05B 45/52; H05B 45/54; F21K 9/232; F21K 9/235; F21K 9/238
See application file for complete search history.

(56) References Cited

U.S. PATENT DOCUMENTS 10,605,413 B1 * 3/2020 Dutta ...................... F21K 9/232
10,663,117 B2 * 5/2020 Chen ..................... F21V 23/006
(Continued)

*Primary Examiner* — Tung X Le
(74) *Attorney, Agent, or Firm* — BAYRAMOGLU LAW OFFICES, LLC

(57) ABSTRACT

An LED bulb without driving power supply includes a lamp cap, a bulb shell, a current limiting resistor, a core column, and an LED filament. The two ends of the LED filament are provided with connection terminals, the substrate of the LED filament is provided with two conductive lines, the two ends of the conductive line are respectively connected to the connection terminal through rectifier diodes. The rectifier diodes at both ends of the same conductive line are arranged in the opposite direction, and the rectifier diodes connecting different conductive lines on the same connection terminal are arranged in the opposite direction. The LED bulb can be directly connected to the external alternating current power supply to light the lighting without a driving power supply, which eliminates the cost of installing the driving power supply.

3 Claims, 7 Drawing Sheets

(51) Int. Cl.
  *F21K 9/238* (2016.01)
  *F21K 9/232* (2016.01)
  *F21Y 115/10* (2016.01)

(56) References Cited

U.S. PATENT DOCUMENTS

| | | | |
|---|---|---|---|
| 2017/0202061 A1* | 7/2017 | Allen | F21V 23/001 |
| 2018/0266636 A1* | 9/2018 | Barp | F21K 9/278 |
| 2019/0195435 A1* | 6/2019 | Ye | F21K 9/232 |
| 2020/0182413 A1* | 6/2020 | Jiang | H05B 45/20 |
| 2022/0186889 A1* | 6/2022 | Hikmet | F21K 9/232 |

* cited by examiner

LED BULB WITHOUT DRIVING POWER SUPPLY

CROSS-REFERENCE TO RELATED APPLICATIONS

This application is a continuation in part of and claims priority to U.S. application Ser. No. 17/179,321, filed on Feb. 18, 2021, entitled "ALTERNATING CURRENT LED FILAMENT", which is based upon and claims priority to Chinese Patent Application No. CN202022082013.1, filed on Sep. 22, 2020, Chinese Patent Application No. CN202022082352.X, filed on Sep. 22, 2020, and Chinese Patent Application No. CN202022217458.6, filed on Sep. 30, 2020, the disclosure of which that is not inconsistent with the present disclosure is incorporated herein by reference.

TECHNICAL FIELD

The disclosure relates to the field of LED lamps, in particular to an LED bulb without driving power supply.

BACKGROUND

LED lamps have been paid much attention because of their advantages of energy saving, durability and environmental protection, which is becoming a new generation of light source and are being popularized and applied. For the traditional direct current (DC) LED light-emitting device, it needs a driving power supply to connect the external alternating current (AC) power supply, which leads to many problems such as high manufacturing cost, affecting the service life of lamps and excessive energy consumption of power supply.

SUMMARY

The disclosure is aimed to overcome the shortcomings of the prior art and provide an LED bulb without driving power supply.

The technical solution adopted by the disclosure is:

An LED bulb without driving power supply, including a lamp cap, a bulb shell, a first current limiting resistor, a core column and an LED filament, and the LED filament includes a substrate, a rectifier diode, and a light-emitting diode.

The two ends of the LED filament are provided with connection terminals, the substrate of the LED filament is provided with two conductive lines, both ends of the two conductive lines are respectively connected to the connection terminal through the rectifier diode, the rectifier diodes at both ends of the same conductive line are arranged in an opposite direction, and the rectifier diodes connected to different conductive lines at the same connection terminal are arranged in the opposite direction, the light-emitting diode is connected to two conductive lines.

The core column is provided with a first conducting wire and a second conducting wire, the LED filament is connected between the first conducting wire and the second conducting wire, and the first conducting wire is connected to the lamp cap after connecting the first current limiting resistor, and the second conducting wire is connected to the lamp cap.

The rectifier diode may be a light-emitting diode or a silicon rectifier diode.

Preferably, the first current limiting resistor and the core column are fused together to form a core column with its own resistance.

Further, it further includes a second current limiting resistor, and the second conducting wire of the core column is connected to the lamp cap after connecting a second current limiting resistor.

Preferably, the first current limiting resistor, the second current limiting resistor and the core column are fused together to form a core column with its own resistance.

The first current limiting resistor and the second current limiting resistor can be arranged inside the sealed cavity formed by the core column and the bulb shell, or they can be set outside the sealed cavity and located in the lamp cap.

Further, the core column is provided with a sealing plug, the sealing plug is provided with at least one sealing hole for holding the first current limiting resistor, the first conducting wire is connected to the lamp cap after connecting the first current limiting resistor, and the second conducting wire passes through the sealing plug and is connected to the lamp cap. The sealing plug is installed at the lower end of the bulb shell, and the outer wall of the sealing plug is fitted with the inner wall of the bulb shell and sealed tightly.

Further, the bulb shell is made of plastic material, the outer side of the lower end of the bulb shell is provided with the external thread, the inner side of the lamp cap is provided with the internal thread, and the external thread is connected to the internal thread in screwed connection.

Another technical solution adopted by the disclosure is:

An LED bulb without driving power supply, including a lamp cap, a bulb shell, a core column and an LED filament, and the LED filament includes a substrate, a rectifier diode, a light-emitting diode and a third current limiting resistor.

The two ends of the LED filament are provided with connection terminals, the substrate of the LED filament is provided with two conductive lines, both ends of the two conductive lines are respectively connected to the connection terminal through the rectifier diode. The rectifier diodes at both ends of the same conductive line are arranged in an opposite direction, and the rectifier diodes connected to different conductive lines at the same connection terminal are arranged in an opposite direction, the light-emitting diode is connected to two conductive lines. At least one third current limiting resistor is arranged at any one or more positions between the connection terminal and the rectifier diode, between the rectifier diode and the conductive line, or between the conductive line and the light-emitting diode, and forms an electrical connection.

The core column is provided with a first conducting wire and a second conducting wire, the LED filament is connected between the first conducting wire and the second conducting wire, and the first conducting wire and the second conducting wire are connected to the lamp cap.

The rectifier diode may be a light-emitting diode or a silicon rectifier diode.

Preferably, the third current limiting resistor is a chip resistor.

Further, the core column is provided with a sealing plug, the first conducting wire and the second conducting wire pass through the sealing plug and are connected to the lamp cap. The sealing plug is installed at the lower end of the bulb shell, and the outer wall of the sealing plug is fitted with the inner wall of the bulb shell and sealed tightly.

Further, the bulb shell is made of plastic material, the outer side of the lower end of the bulb shell is provided with the external thread, the inner side of the lamp cap is provided with the internal thread, and the external thread is connected to the internal thread in screwed connection.

Further, it further includes a fourth current limiting resistor, and the first conducting wire or the second conducting wire of the core column is connected to the fourth current limiting resistor and then connected to the lamp cap.

Preferably, the fourth current limiting resistor and the core column are fused together to form a core column with its own resistance.

Furthermore, it further includes the fifth current limiting resistor and the sixth current limiting resistor; the first conducting wire and the second conducting wire of the core column are respectively connected to the fifth current limiting resistor and the sixth current limiting resistor and then connected to the lamp cap.

Preferably, the fifth current limiting resistor, the sixth current limiting resistor and the core column are fused together to form a core column with its own resistance.

The fourth current limiting resistor, the fifth current limiting resistor, and the sixth current limiting resistor can be arranged inside the sealed cavity formed by the core column and the bulb shell, or they can be set outside the sealed cavity and located in the lamp cap.

Further, the third current limiting resistor can be replaced by a constant current IC so that the constant effectiveness of the lamp filament is better and more stable.

The disclosure adopts the above technical solution to realize that the LED bulb can be directly connected to the external alternating current power supply for lighting without a driving power supply. The disclosure eliminates the cost of installing the driving power supply, has simple structure and high production efficiency, greatly reduces the manufacturing cost of the LED bulb, has good stability, and is suitable for more kinds of external power supplies. The cost of the bulb produced by the disclosure is 40%-60% lower than that of other bulbs requiring installation of driving power supply.

By setting the current limiting resistor, the disclosure limits the working current of the LED (light-emitting diode) string on the LED filament, so that the number of chips of the LED string cannot be limited by the external power supply voltage, and the number of LED chips can also be set according to the requirements of power and brightness.

By selecting current limiting resistors with different resistance values to adapt to different external voltages in different countries or regions: assuming that the number of LED chips connected in series on the filament substrate is the same, a current limiting resistor with small resistance value is selected to adapt to the AC voltage of 110V. As for the AC voltage of 220V, a current limiting resistor with relatively large resistance may be selected for adaptation.

The different requirements from different customers for LED bulb power and brightness can be met by connecting different numbers of LEDs and resistors with different resistance values in series. For the demand of high power and brightness, current limiting resistors with small resistance and a large number of LED chips can be connected in series; for the demand of low power and low brightness, the current limiting resistors with large resistance and a small number of LEDs can be connected in series.

In addition, the disclosure also prevents water or moisture from entering the bulb shell by providing of the sealing plug, so that no mist will be generated when the bulb is lit, with good lighting effect, better reliability and longer service life.

BRIEF DESCRIPTION OF THE DRAWINGS

The disclosure will be further described in detail below in combination with the accompanying drawings and specific embodiments.

DETAILED DESCRIPTION OF THE EMBODIMENTS

The present disclosure is introduced by the following specific embodiments.

Embodiment 1

Figure 1:
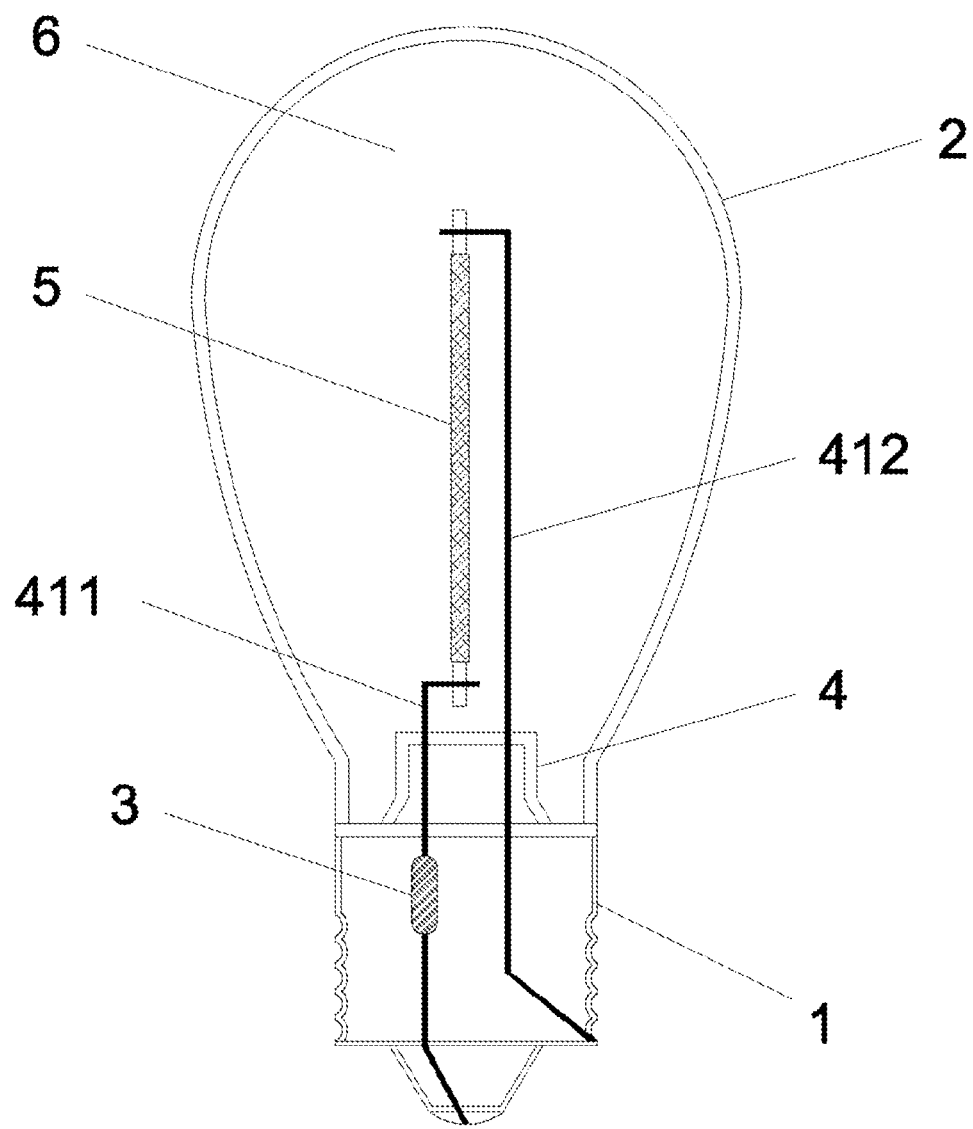
FIG. 1 is a structural diagram of an LED bulb without driving power supply in the Embodiment 1 of the present disclosure.

As shown in FIG. 1, the Embodiment 1 discloses an LED bulb without driving power supply, including a lamp cap 1, a bulb shell 2, a first current limiting resistor 3, a core column 4 and an LED filament 5, and the LED filament 5 includes a substrate, a rectifier diode and a light-emitting diode 54.

Figure 2:
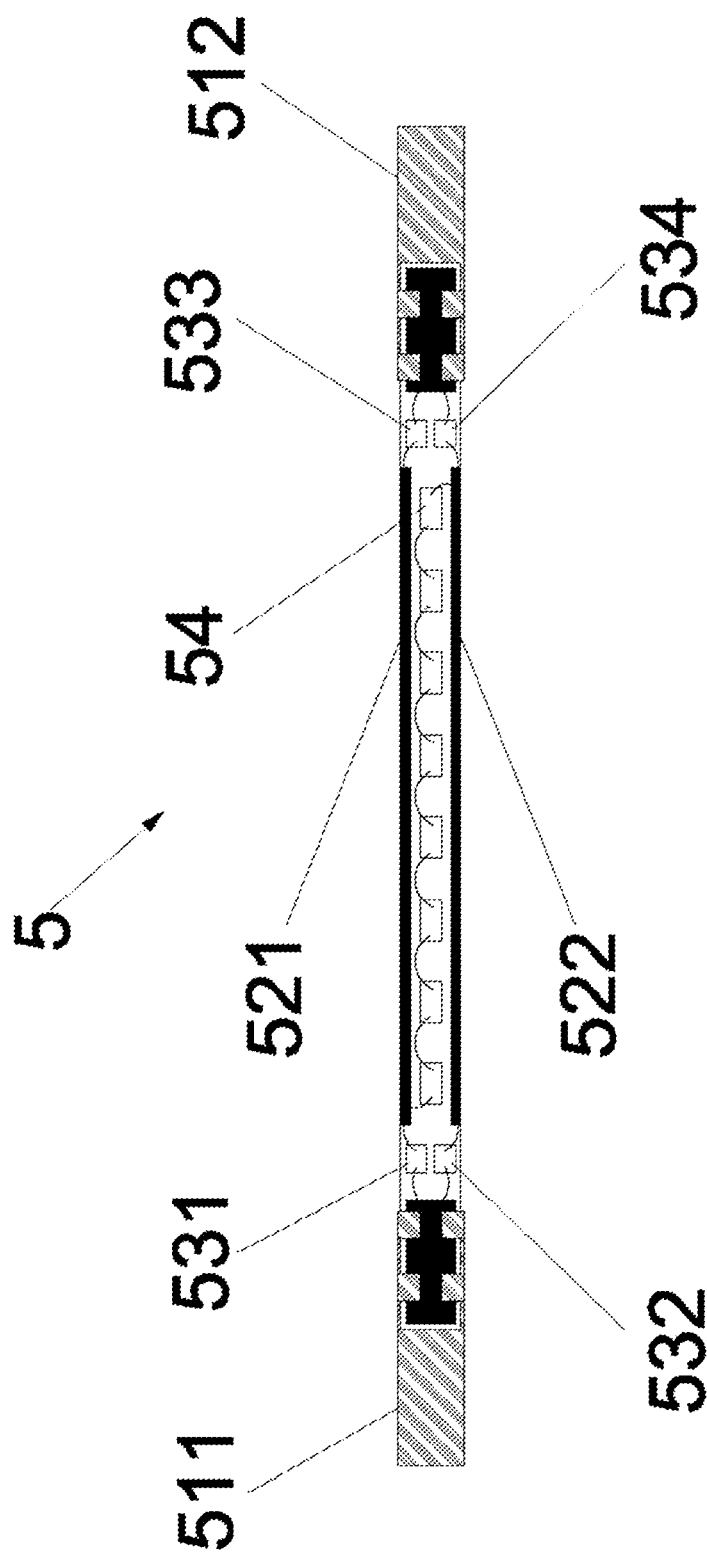
FIG. 2 is a schematic diagram of the filament structure of the LED bulb without driving power supply in the Embodiment 1 of the present disclosure.

As shown in FIG. 2, both ends of the LED filament 5 of the embodiment 1 are provided with connection terminals 511,512. The substrate of the LED filament is provided with two conductive lines 521, 522. Both ends of the two conductive lines 521, 522 are respectively connected to the connection terminals 511,512 through rectifier diodes 531, 532, 533 and 534. The rectifier diodes 531,533 at both ends of one conductive line 521 are arranged in the opposite direction, and the rectifier diodes 532, 534 at both ends of the other conductive line 522 are arranged in the opposite direction. The rectifier diodes 531, 532 connected to different conductive lines on one connection terminal 511 are arranged in the opposite direction, and the rectifier diodes 533, 534 connected to different conductive lines on the other connection terminal 512 are arranged in the opposite direction. The light-emitting diodes 54 are connected to two conductive lines 521, 522.

The rectifier diode is a silicon rectifier diode chip. It is only necessary to paste the rectifier diode chip on the filament substrate while pasting the LED chip during the filament manufacturing process, without adding additional pasting process, which has the advantages of convenient production and processing and low manufacturing cost. In addition, the silicon rectifier diode has high reverse withstand voltage, safer use and longer service life.

As shown in FIG. 1, the core column 4 is provided with the first conducting wire 411 and the second conducting wire 412, and the LED filament 5 is connected between the first conducting wire 411 and the second conducting wire 412. The first conducting wire 411 is connected to the first current limiting resistor 3, and then connected to the lamp cap 1, and the second conducting wire 412 is connected to the lamp cap 1. Alternatively, the second conducting wire 412 of the core column 4 is connected to the lamp cap after connecting a second current limiting resistor.

The first current limiting resistor 3 is arranged outside the sealed cavity 6 formed by the core column 4 and the bulb shell 2 and is located in the lamp cap 1, which is conducive to the heat dissipation of resistors, safer use and longer service life.

The bulb shell 2 may be made of plastic material, the outer side of the lower end of the bulb shell 2 is provided with the external thread, the inner side of the lamp cap 1 is provided with the internal thread, and the external thread is connected to the internal thread in screwed connection. In this way, the bulb can be easily disassembled when parts need to be replaced, which is convenient and fast. The inner and outer threads can also be coated with sealant to improve the tightness of the bulb.

Embodiment 2

The Embodiment 1 discloses an LED bulb without driving power supply, which includes a lamp cap 1, a bulb shell 2, a first current limiting resistor 3, a core column 4 and an LED filament 5.

Figure 3:
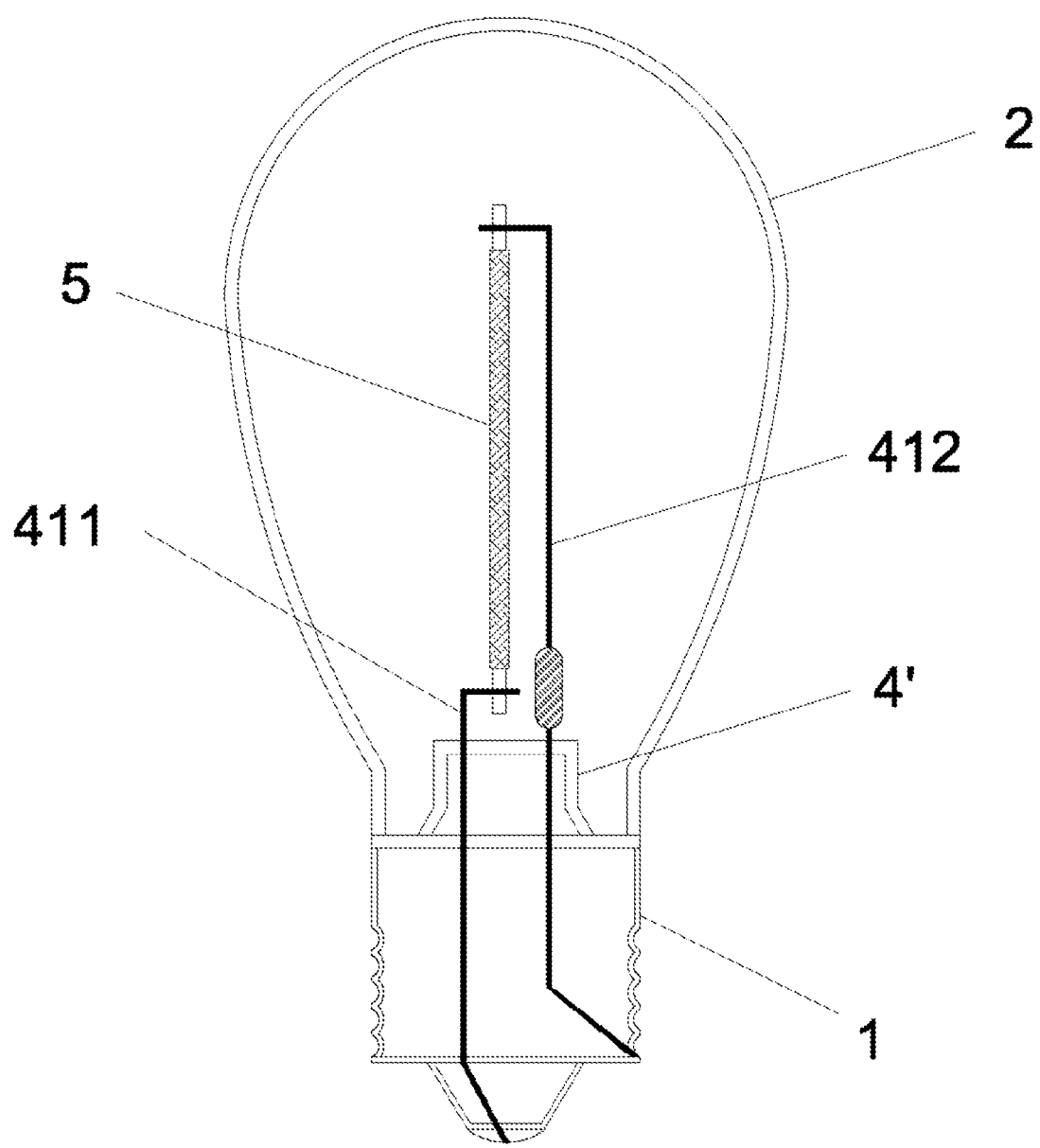
FIG. 3 is a structural diagram of the LED bulb without driving power supply in the Embodiment 2 of the present disclosure.

As shown in FIG. 3, the difference between the Embodiment 2 and the Embodiment 1 is that in the manufacturing process of the core column 4, the first current limiting resistor 3 and the core column 4 are fused together to form a core column 4' with its own resistance, which eliminates the process of welding resistor in the subsequent bulb assembly process and further reduces the manufacturing cost.

Figure 4:
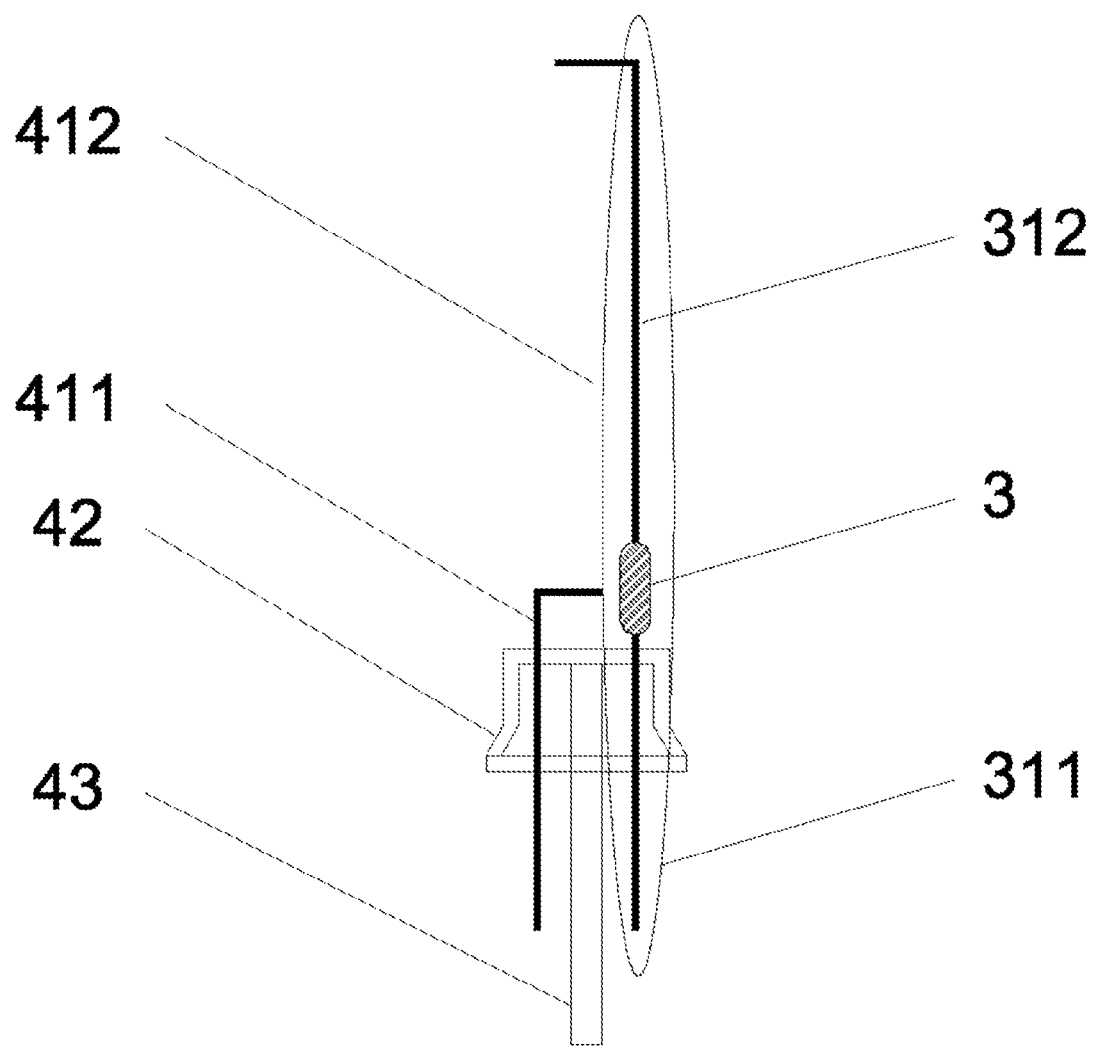
FIG. 4 is a schematic diagram of the core column structure of the LED bulb without driving power supply in the Embodiment 2 of the present disclosure.

As shown in FIG. 4, the core column 4' with its own resistance includes a glass horn tube 42, an exhaust pipe 43, a first current limiting resistor 3 and a first conducting wire 411. Both ends of the first current limiting resistor 3 are provided with a first pin 311 and a second pin 312. The first current limiting resistor 3 and the two pins 311,312 at both ends of the first current limiting resistor 3 are combined into the second conducting wire 412 of the core column 4'. The first pin 311, the first conducting wire 411 and the exhaust pipe 43 are performed a high-temperature fusion with the top of the glass horn pipe 42. In order to ensure the fusion effect, the first conducting wire 411 and the first pin 311 are made of magnesium wire, and the second pin 312 is made of metal materials such as nickel, iron, copper or aluminum, so as to reduce the production cost.

The body of the first current limiting resistor 3 can be located above the glass horn tube, inside the glass horn tube or below the glass horn tube according to specific requirements.

Embodiment 3

The Embodiment 1 discloses an LED bulb without driving power supply, which includes a lamp cap 1, a bulb shell 2, a first current limiting resistor 3, a core column 4 and an LED filament 5.

Figure 5:
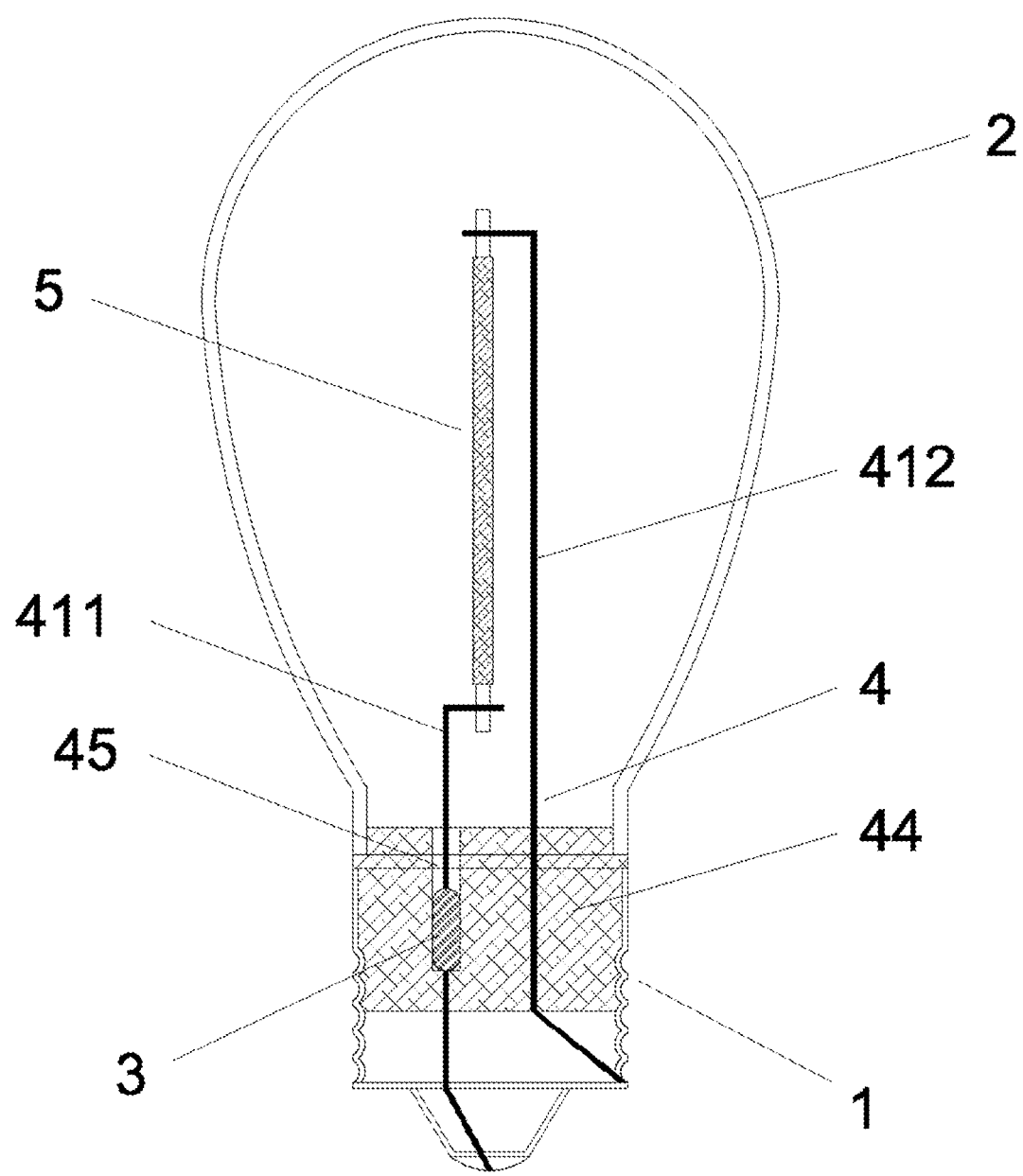
FIG. 5 is a structural diagram of the LED bulb without driving power supply in the Embodiment 3 of the present disclosure.

As shown in FIG. 5, the difference between the Embodiment 3 and the Embodiment 1 is that the core column 4 is provided with a sealing plug 44, and the sealing plug 44 is provided with at least one sealing hole 45 for holding the first current limiting resistor 3. The first conducting wire 411 is connected to the lamp cap 1 after connecting the first current limiting resistor 3, and the second conducting wire 412 is connected to the lamp cap 1 after a one-time piercing the sealing plug. The sealing plug 44 is installed at the lower end of the bulb shell 2. The outer wall of the sealing plug 44 fits and seals tightly with the inner wall of the bulb shell 2 to prevent water or moisture from entering the bulb shell 2, so that no mist will be generated when the bulb is lit, with good lighting effect, better reliability, and longer service life.

The core column 4 can also adopt a plastic colloidal core column with its own resistance, fixing the first current limiting resistor 3, the first conducting wire 411 and the second conducting wire 412 in a rubber plug through an injection molding process.

The bulb shell 2 can also be made of plastic material, the outer side of the lower end of the bulb shell is provided with an external thread, the inner side of the lamp cap is provided with an internal thread, and the external thread is connected to the internal thread in screwed connection. In this way, the bulb can be easily disassembled when parts need to be replaced, which is convenient and fast. The inner and outer threads can also be coated with sealant to improve the tightness of the bulb.

Embodiment 4

Figure 6:
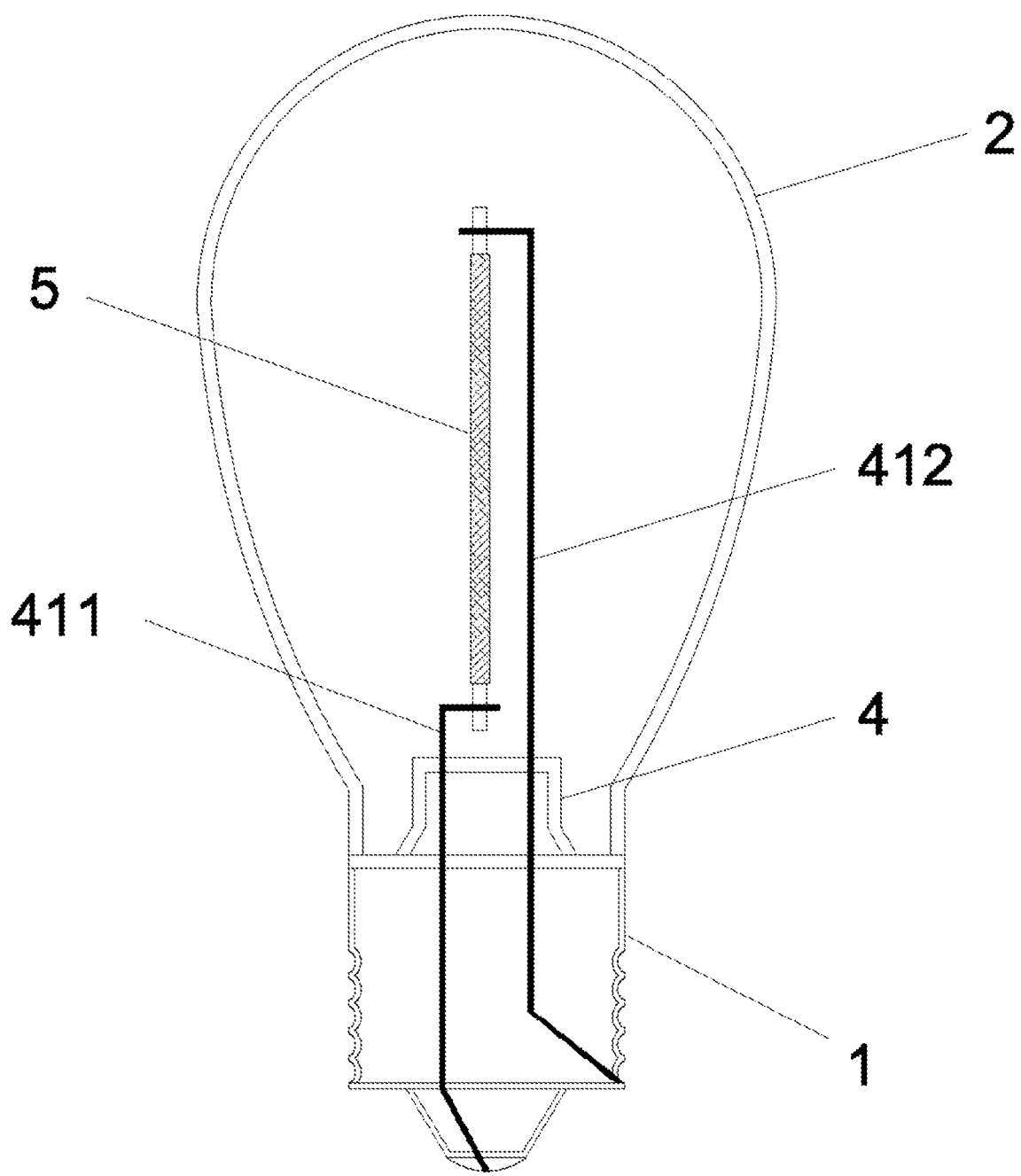
FIG. 6 is a structural diagram of the LED bulb without driving power supply in the Embodiment 4 of the present disclosure.

As shown in FIG. 6, the Embodiment 4 discloses an LED bulb without driving power supply, which includes a lamp cap 1, a bulb shell 2, a core column 4 and an LED filament 5. The LED filament 5 includes a substrate, a rectifier diode, a light-emitting diode 54 and two third current limiting resistors 551,552.

Figure 7:
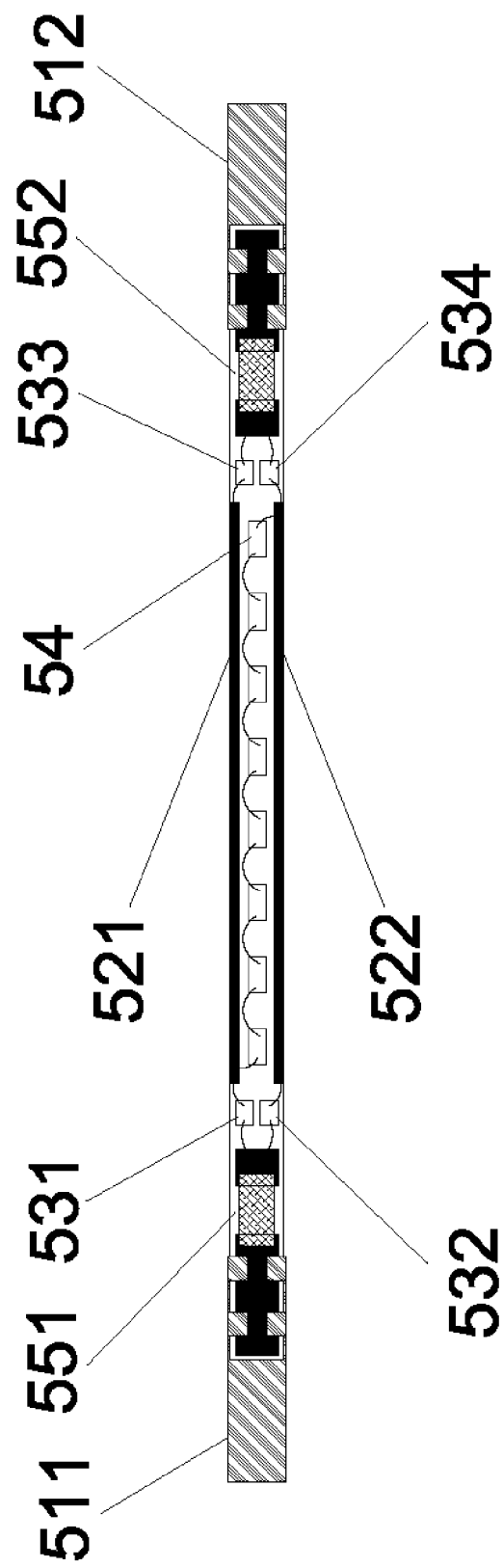
FIG. 7 is a schematic diagram of the filament structure of the LED bulb without driving power supply in the Embodiment 4 of the present disclosure.

As shown in FIG. 7, both ends of the LED filament 5 of the Embodiment 4 are provided with connection terminals 511,512. The substrate of the LED filament is provided with two conductive lines 521, 522. Both ends of the two conductive lines 521, 522 are respectively connected to the connection terminals 511, 512 through rectifier diodes 531, 532, 533 and 534. The rectifier diodes 531, 533 at both ends of one conductive line 521 are arranged in the opposite direction, and the rectifier diodes 532, 534 at both ends of the other conductive line 522 are arranged in the opposite direction. The rectifier diodes 531, 532 connected to different conductive lines on one connection terminal 511 are arranged in the opposite direction, and the rectifier diodes 533, 534 connected to different conductive lines on the other connection terminal 512 are arranged in the opposite direction. The light-emitting diode 54 is connected to two conductive lines 521, 522, a third current limiting resistor 551 is connected between one of the connection terminals 511 and the rectifier diodes 531 and 532 on the connection terminal 511, and the other third current limiting resistor 552 is connected between the other connection terminal 512 and the rectifier diodes 533 and 534 on the connection terminal 512.

The third current limiting resistors 551 and 552 are chip resistors. It is only necessary to paste the chip resistor on the substrate of the filament while pasting the LED chip on the filament during the filament manufacturing process, which eliminates the process of welding resistor in the subsequent bulb assembly process, facilitates production and processing, and further reduces the manufacturing cost.

As shown in FIG. 6, the core column 4 is provided with a first conducting wire 411 and a second conducting wire 412, the LED filament 5 is connected between the first conducting wire and the second conducting wire, and the first conducting wire 411 and the second wire conducting 412 are respectively connected to two input ends of the lamp cap 1. The first conducting wire 411 or the second conducting wire 412 of the core column can also be connected to a fourth current limiting resistor and then connected to the lamp cap 1. Alternatively, the first conducting wire 411 and the second conducting wire 412 of the core column are connected to the fifth current limiting resistor and the sixth current limiting resistor respectively, and then connected to the lamp cap 1.

The bulb shell 2 may be made of plastic material, the outer side of the lower end of the bulb shell 2 is provided with the external thread, the inner side of the lamp cap 1 is provided with the internal thread, and the external thread is connected to the internal thread in screwed connection. In this way, the bulb can be easily disassembled when parts need to be replaced, which is convenient and fast. The inner and outer threads can also be coated with sealant to improve the tightness of the bulb.

Embodiment 5

The difference between the Embodiment 5 and the Embodiment 4 is that the fourth current limiting resistor and the core column are fused together to form a core column with its own resistance.

Embodiment 6

The difference between the Embodiment 6 and the Embodiment 4 is that the core column is provided with a sealing plug, the first conducting wire and the second conducting wire pass through the sealing plug and are connected to the lamp cap. The sealing plug is installed at the lower end of the bulb shell, and the outer wall of the sealing plug is fitted with the inner wall of the bulb shell and sealed tightly.

The basic principles and main features of the disclosure and the advantages of the disclosure are shown and described above. Those skilled in the art should understand that the disclosure is not limited by the above embodiments. What is described in the above embodiments and specifications is only to explain the principle of the disclosure. On the premise of not departing from the spirit and scope of the disclosure, the disclosure will have various modifications and improvements, which fall within the scope of the claimed disclosure. The scope claimed by the disclosure is defined by the appended claims and their equivalents.

What is claimed is:

1. An LED bulb without driving power supply, comprising a lamp cap, a bulb shell, a core column and an LED filament, and the LED filament comprises a substrate, rectifier diodes, a light-emitting diode and at least one current limiting resistor, wherein two ends of the LED filament are provided with connection terminals, the substrate of the LED filament is provided with two conductive lines comprising a first conductive line and a second conductive line, two ends of the two conductive lines are respectively connected to the connection terminals through the rectifier diodes, the rectifier diodes at two ends of the first conductive line or the second conductive line are arranged in an opposite direction, and the rectifier diodes connected to the first conductive line and the second conductive line, respectively, at one of the connection terminals are arranged in an opposite direction, the light-emitting diode is connected to the two conductive lines, the at least one current limiting resistor is arranged at least one position selected from the group consisting of a position between one of the connection terminals and one of the rectifier diodes, a position between one of the rectifier diodes and one of the two conductive lines, and a position between one of the two conductive lines and the light-emitting diode, to form an electrical connection;

the core column is provided with a first conducting wire and a second conducting wire, the LED filament is connected between the first conducting wire and the second conducting wire, and the first conducting wire and the second conducting wire are connected to the lamp cap.

2. The LED bulb according to claim 1, wherein
the core column is provided with a sealing plug,
the first conducting wire and the second conducting wire pass through the sealing plug and are connected to the lamp cap;
the sealing plug is installed at a lower end of the bulb shell, and
an outer wall of the sealing plug is fitted with an inner wall of the bulb shell and sealed tightly.

3. The LED bulb according to claim 1, wherein
the bulb shell is made of plastic material,
an outer side of a lower end of the bulb shell is provided with an external thread,
an inner side of the lamp cap is provided with an internal thread, and
the external thread is connected to the internal thread in a screwed connection.

\* \* \* \* \*